US010332601B2

(12) United States Patent
Yip

(10) Patent No.: US 10,332,601 B2
(45) Date of Patent: Jun. 25, 2019

(54) ERASING MEMORY CELLS SEQUENTIALLY

(71) Applicant: MICRON TECHNOLOGY, INC., Boise, ID (US)

(72) Inventor: Aaron S. Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/687,581

(22) Filed: Aug. 28, 2017

(65) Prior Publication Data

US 2019/0066797 A1 Feb. 28, 2019

(51) Int. Cl.

*G11C 16/04* (2006.01)
*G11C 16/14* (2006.01)
*G11C 16/26* (2006.01)

(52) U.S. Cl.

CPC .............. *G11C 16/14* (2013.01); *G11C 16/26* (2013.01)

(58) Field of Classification Search

CPC ................................ G11C 16/14; G11C 16/26
USPC ..................................................... 365/185.24
See application file for complete search history.

(56) References Cited

U.S. PATENT DOCUMENTS

| | | | | |
|---|---|---|---|---|
| 9,711,228 | B1 | 7/2017 | Tanzana | |
| 2013/0332769 | A1 | 12/2013 | Parat et al. | |
| 2014/0226414 | A1* | 8/2014 | Costa | G11C 16/3445 365/185.22 |
| 2017/0092368 | A1* | 3/2017 | Suito | G11C 16/0483 |

* cited by examiner

*Primary Examiner* — Tha-O H Bui

(74) *Attorney, Agent, or Firm* — Dicke, Billig & Czaja, PLLC

(57) ABSTRACT

Methods include applying a first voltage to channel regions of a plurality of memory cells; applying a lower second voltage to each access line of a plurality of access lines coupled to the memory cells other than a first set of access lines; applying a lower third voltage to the first set of access lines while applying the first voltage and the second voltage; determining a desired voltage level of the third voltage for a subsequent set of access lines; and applying the third voltage to the subsequent set of access lines while applying the first voltage and while applying the second voltage to each access line of the plurality of access lines other than the subsequent set of access lines. Methods further include methods of determining the desired voltage level for the third voltage for each set of access lines.

26 Claims, 12 Drawing Sheets

200B
$204_M$
$215_0$
$215_1$
$215_L$
$204_1$
212
$204_0$
$202_N$
$202_{N-1}$
$202_1$
$202_0$
214
206
216
210

1070
1072
Voltage
1076
1074
1078
1080
1082
1084
t0 t1 t2 t3 t4 t5 t6 t7
Time

ERASING MEMORY CELLS SEQUENTIALLY

TECHNICAL FIELD

The present disclosure relates generally to memory and, in particular, in one or more embodiments, the present disclosure relates to erasing memory cells.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Memory cells are typically erased before they are programmed to a desired data state. For example, memory cells of a particular block of memory cells may first be erased and then selectively programmed. For a NAND array, a block of memory cells is typically erased by grounding all of the access lines (e.g., word lines) in the block and applying an erase voltage to the channel regions of the memory cells (e.g., through data lines and source connections) in order to remove charges that might be stored on data-storage structures (e.g., floating gates or charge traps) of the block of memory cells. Typical erase voltages might be on the order of 25V before completion of an erase operation.

DETAILED DESCRIPTION

Figure 1:
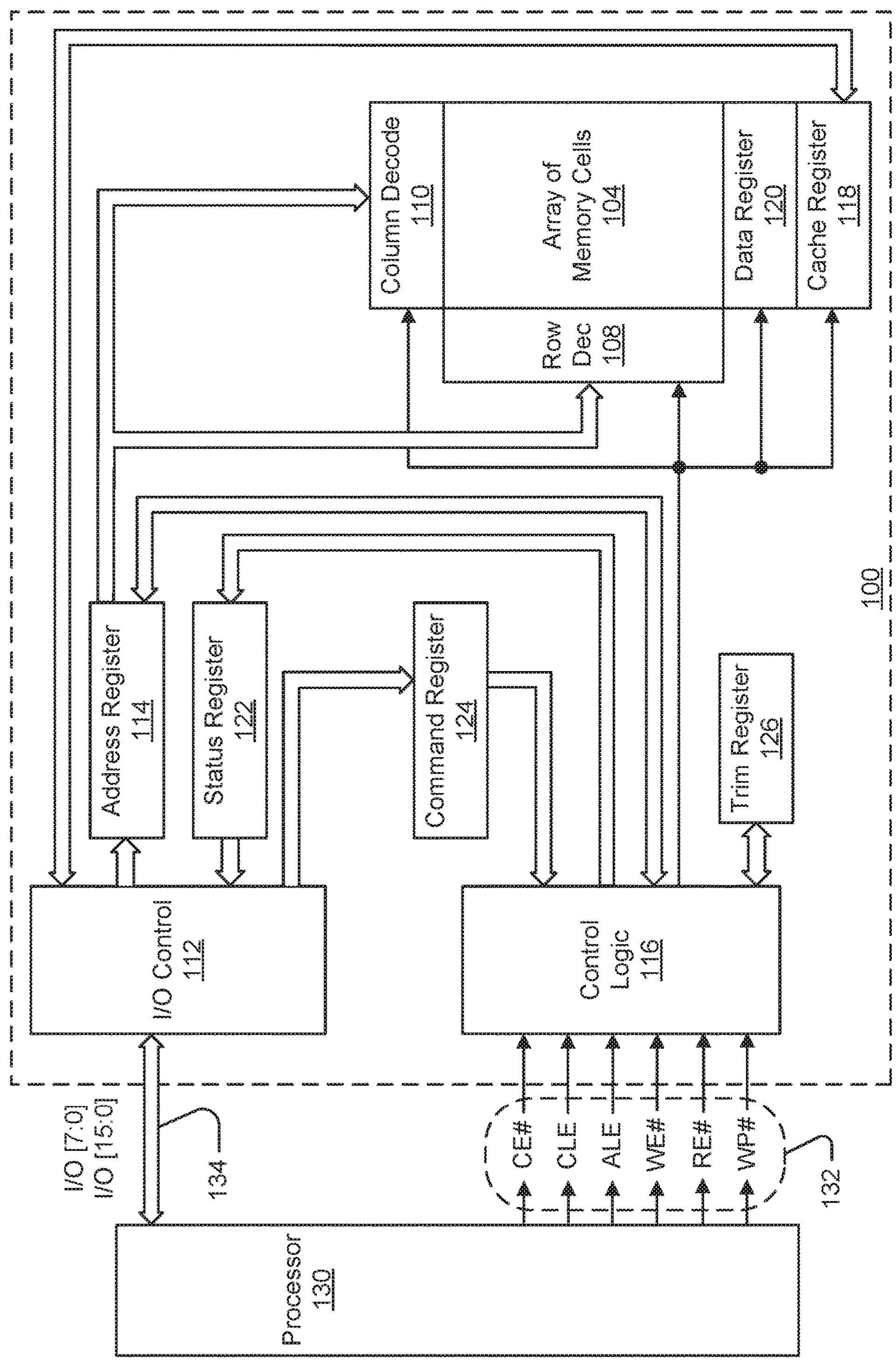
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 126 may be in communication with the control logic 116 to store trim data. Although depicted as a separate storage register, trim register 126 may represent a portion of the array of memory cells 104.

A controller (e.g., control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
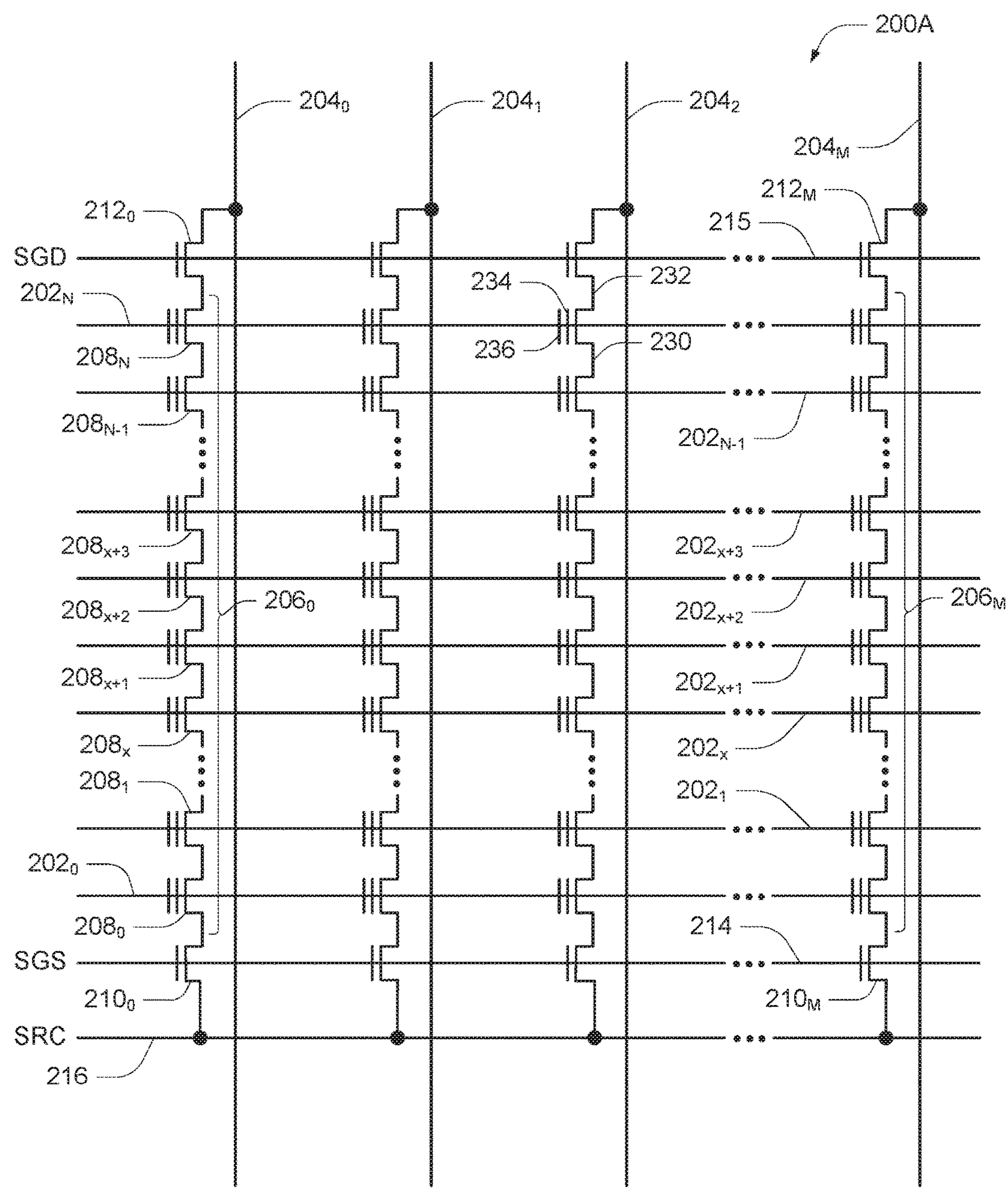
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $\mathbf{202}_0$ to $\mathbf{202}_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source 216 and might include memory cells $\mathbf{208}_0$ to $\mathbf{208}_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
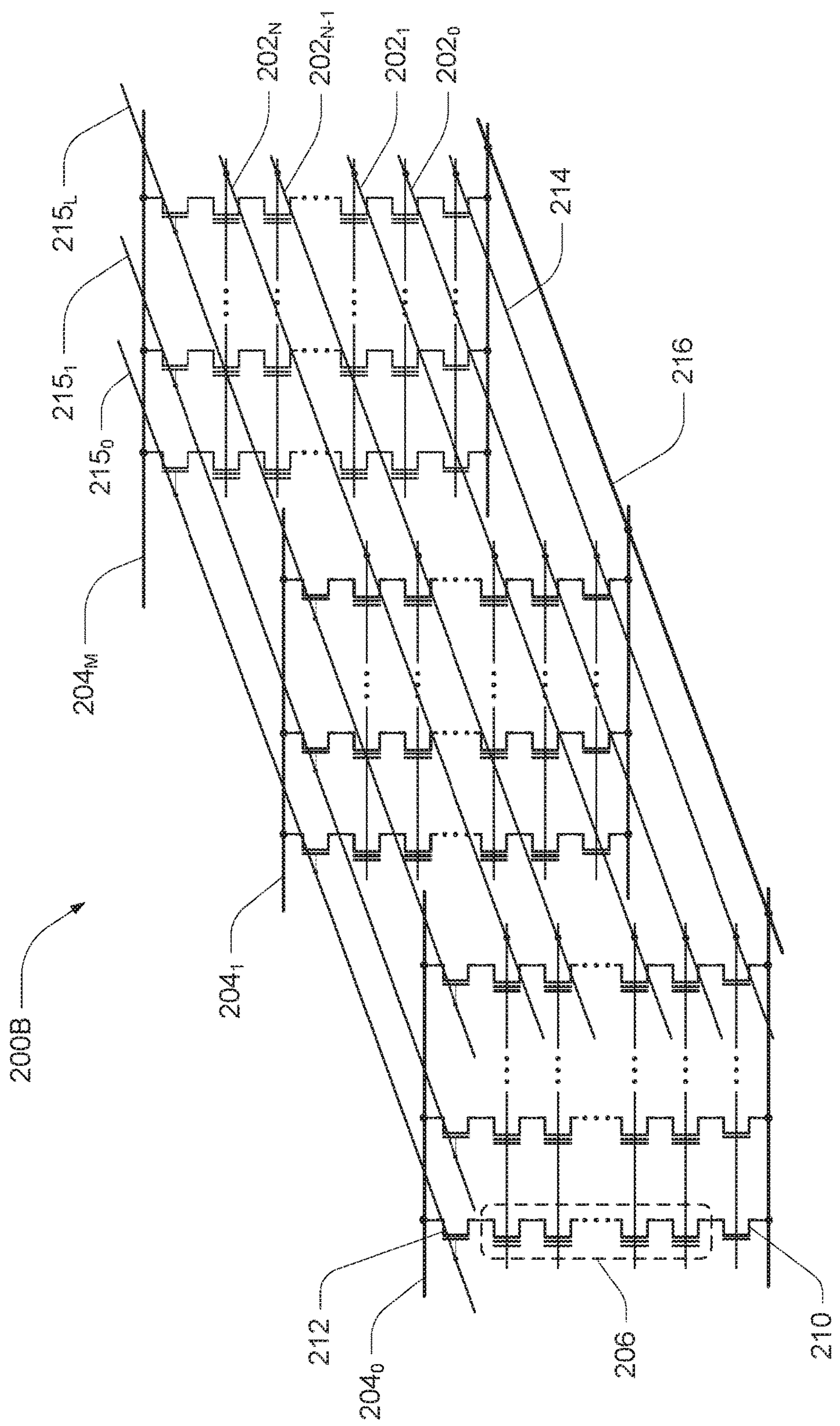

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3:
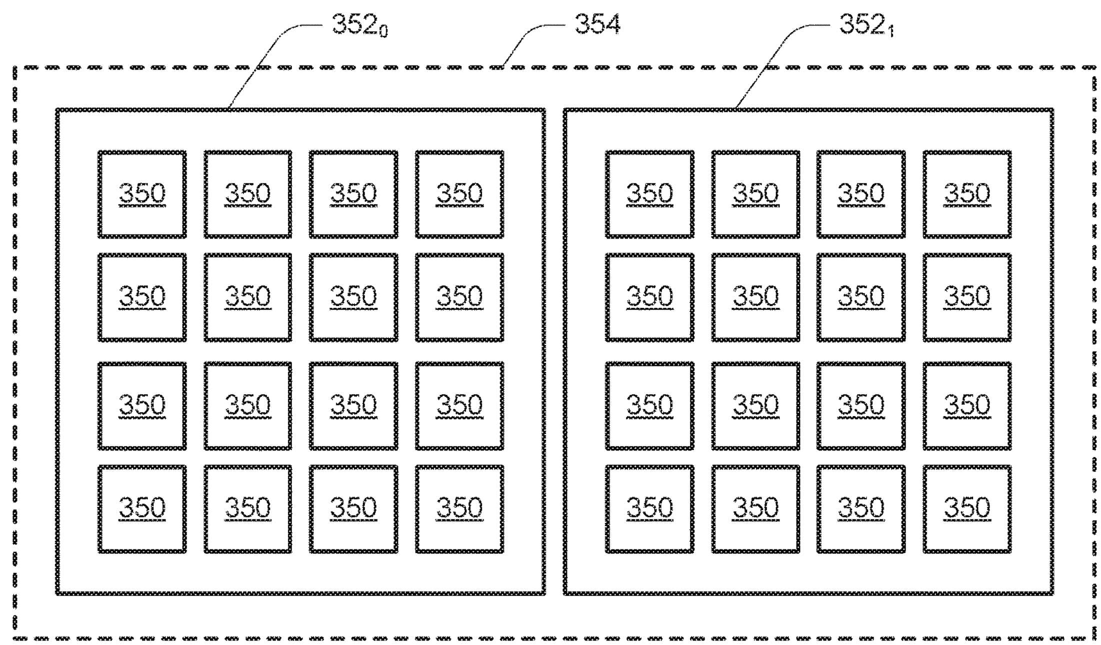
FIG. 3 is a conceptual view of the organization of a die containing an apparatus in accordance with an embodiment having an array of memory cells.

FIG. 3 is a conceptual view of the organization of a die 354 containing an apparatus having an array of memory cells in accordance with an embodiment. The die 354 may contain one or more planes 352, with each plane 352 containing a number of blocks of memory cells 350 of an array of memory cells. Each block of memory cells 350 may include memory cells that are capable of being erased concurrently. Blocks of memory cells 350 of one plane 352 may be accessible (e.g., written to, read from, or erased) concurrently with blocks of memory cells 350 of a different plane 352. In addition, a subset of the blocks of memory cells 350 of a plane 352 may be accessible concurrently with a different subset of the blocks of memory cells 350 of that plane 352.

Figure 4:
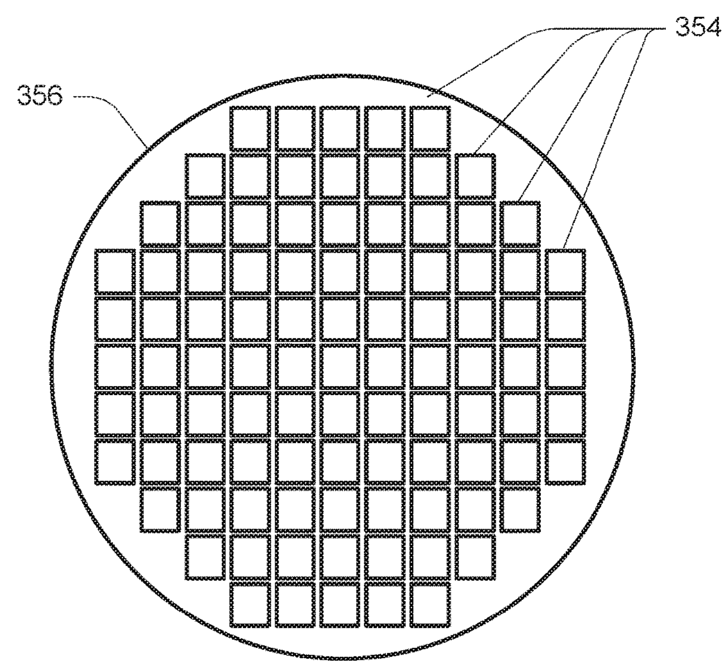
FIG. 4 is a top view of a semiconductor wafer containing a number of dies containing an apparatus in accordance with an embodiment having an array of memory cells.

FIG. 4 is a top view of a semiconductor wafer 356 containing a number of dies 354 containing an apparatus having an array of memory cells in accordance with an embodiment. The dies 354 are often fabricated on the semiconductor wafer 356 concurrently, using the same processing to form the same circuitry on each die 354. However, due to inherent variations in industrial processing, different dies 354, and even different portions of the same die 354, may demonstrate different performance characteristics. For example, different dies 354 of the semiconductor wafer 356, operating under the same parameters, may produce differing threshold voltage distributions in response to an erase operations. Similarly, different blocks of memory cells of a single die 354, operating under the same parameters, may produce differing threshold voltage distributions in response to an erase operations. And memory cells coupled to different access lines of a single block of memory cells, operating under the same parameters, may produce differing threshold voltage distributions in response to an erase operations. While differences are generally expected, some generalizations may be made, either empirically or through testing, regarding how different access lines, blocks of memory cells or dies may perform relative to each other.

As previously discussed, memory cells are typically erased to remove charge from their data-storage structures prior to programming the memory cells to have a desired data state. Erase operations typically involve applying an elevated voltage, e.g., an erase pulse, to channel regions of the memory cells while applying a lower voltage to the access lines coupled to those memory cells. An erase verify operation may then be performed to detect whether the memory cells are sufficiently erased, e.g., whether the memory cells have a distribution of threshold voltages below some threshold, e.g., below some threshold voltage value deemed a high limit of erased threshold voltages. If the erase verify operation fails, an additional erase pulse might be applied.

Due to the processing variability and/or other factors, an erase threshold voltage distribution for the memory cells coupled to one access line of a block of memory cells may be different than the erase threshold voltage distributions for the memory cells coupled to other access lines of the block of memory cells. FIGS. 5A-5D depict visualizations of erase threshold voltage distributions for individual access lines and resulting erase threshold voltage distributions.

Figure 5A:
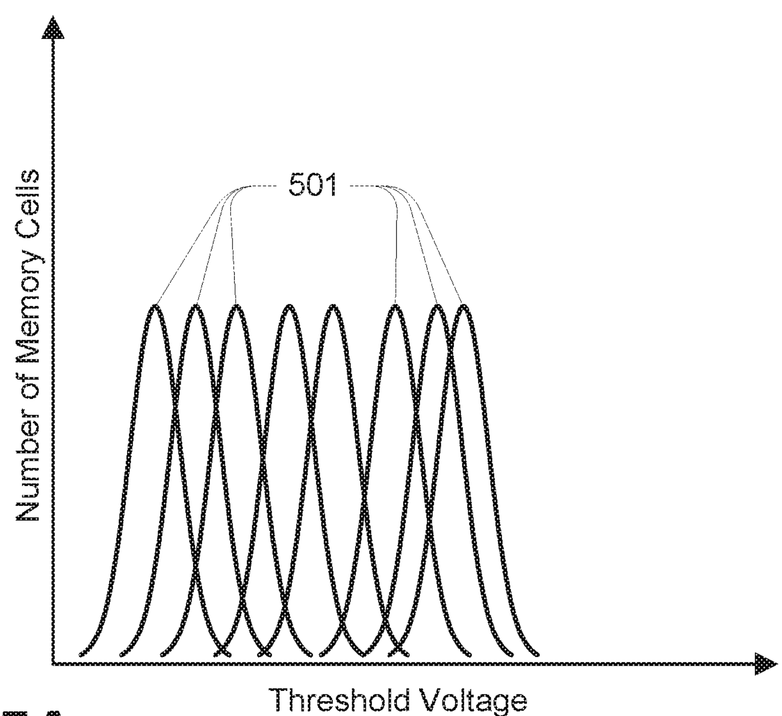
FIGS. 5A-5D depict visualizations of erase threshold voltage distributions for individual access lines and resulting erase threshold voltage distributions.
Figure 5B:
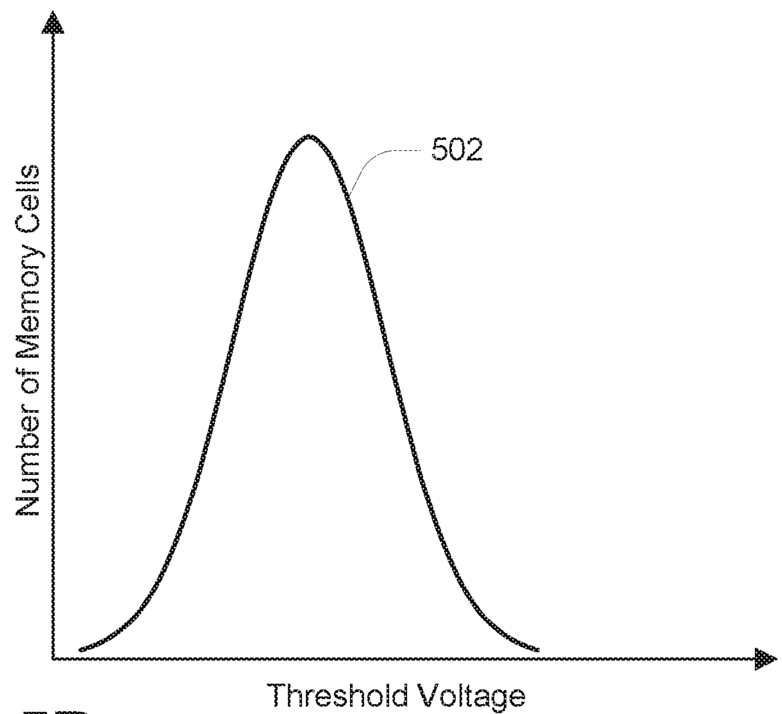

FIG. 5A depicts a visualization of a plurality of erase threshold voltage distributions 501 as might be obtained in response to applying an erase pulse while applying a particular voltage (e.g., 0V) to each access line of a block of memory cells. Each erase threshold voltage distribution 501 may correspond to the memory cells coupled to a single access line of a block of memory cells. Alternatively, one or more of the erase threshold voltage distributions 501 may correspond to the memory cells coupled to a more than one access line of the block of memory cells. FIG. 5B depicts a visualization of a collective erase threshold voltage distribution 502 for the block of memory cells, e.g., representing a combination of the erase threshold voltage distributions 501 from the most negative erase threshold voltage to the most positive erase threshold voltage of the erase threshold voltage distributions 501.

It may be desirable to reduce the width of the erase threshold voltage distribution 502 of a block of memory cells. For example, programming of memory cells starting from a same initial threshold voltage, or at least a more narrow distribution of threshold voltages, may be more predictable and may facilitate more narrow distributions of threshold voltages for each resulting data state. Prior solutions include applying a number of different voltages to the access lines of the block of memory cells receiving the erase pulse to de-bias some access lines to shift their resulting threshold voltage distributions.

Figure 5C:
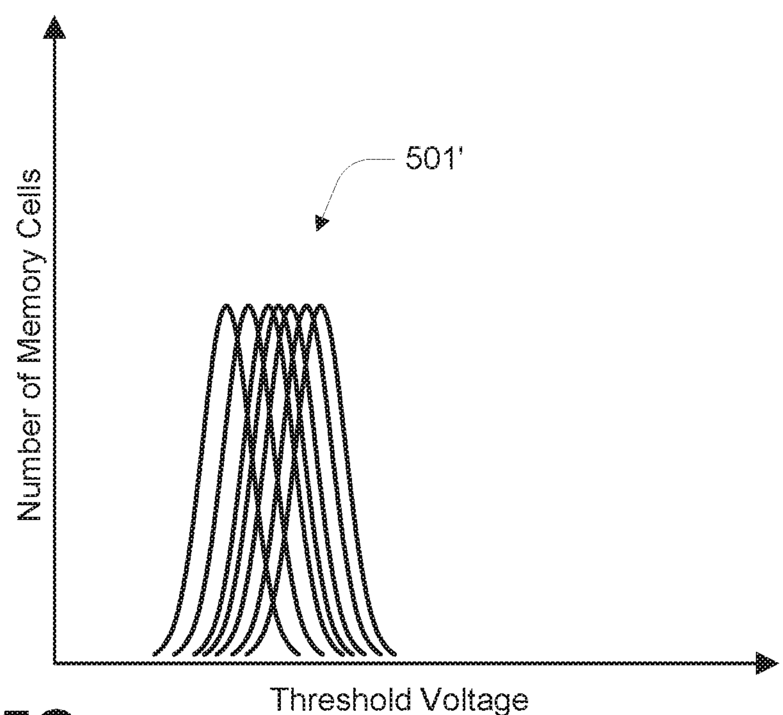
Figure 5D:
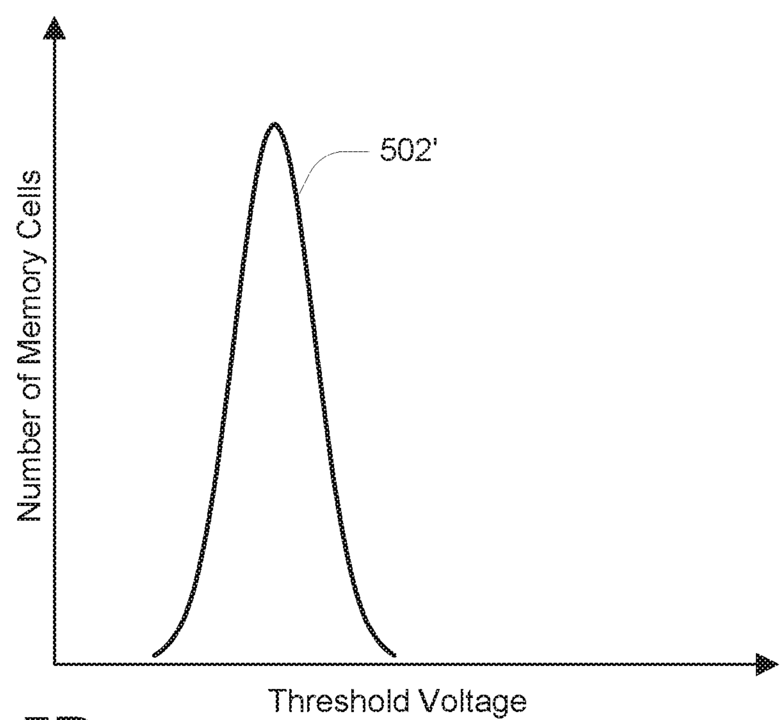

FIG. 5C depicts a visualization of a plurality of erase threshold voltage distributions 501' as might be obtained in response to applying an erase pulse while applying a number of different voltages to the access lines of a block of memory cells. Each erase threshold voltage distribution 501' may correspond to the memory cells coupled to a single access line of a block of memory cells. Alternatively, one or more of the erase threshold voltage distributions 501' may correspond to the memory cells coupled to a more than one access line of the block of memory cells. In comparison to the example of FIG. 5A, the example of FIG. 5C may produce a closer grouping of the erase threshold voltage distributions 501'. As a result, the collective erase threshold voltage distribution 502' for the block of memory cells, e.g., representing a combination of the erase threshold voltage distributions 501', depicted in FIG. 5D may be more narrow. However, multiple voltages require multiple voltage sources, e.g., internal voltage generation circuits, which can increase the size of the die containing the array of memory cells. This variability will be discussed with reference to a particular structure of 3D NAND memory. However, various embodiments are suitable for other array architectures.

Figure 6A:
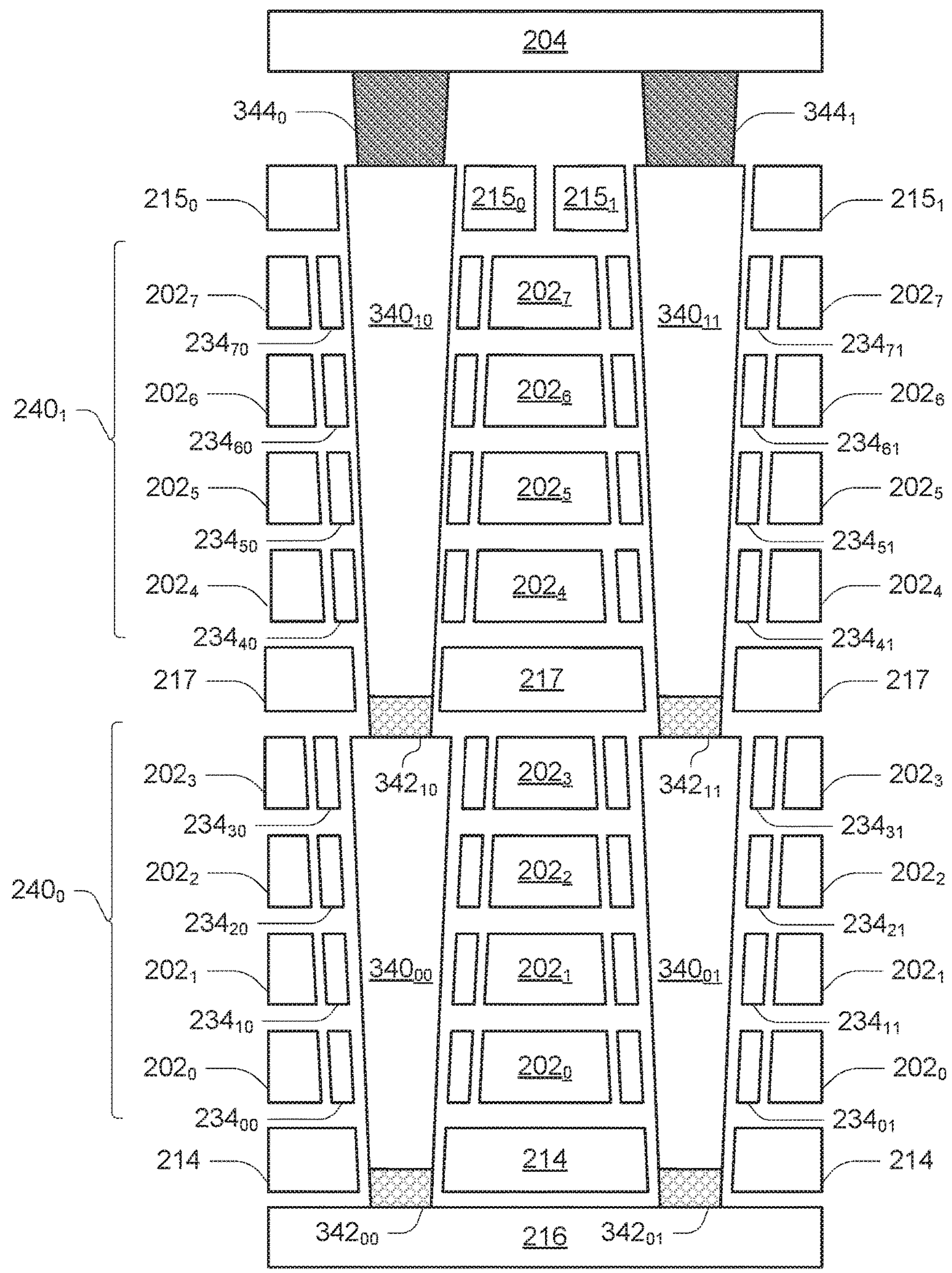
FIG. 6A is a cross-sectional view of a portion of a block of memory cells as might be used with various embodiments.

FIG. 6A is a cross-sectional view of a portion of a block of memory cells as might be used with various embodiments. Three-dimensional memory arrays are typically fabricated by forming alternating layers of conductors and dielectrics, forming holes in these layers, forming additional materials on sidewalls of the holes to define gate stacks for memory cells and other gates, and subsequently filling the holes with a semiconductor material to define a pillar section to act as channels of the memory cells and gates. To improve conductivity of pillar sections and an adjacent semiconductor material, e.g., upon which they are formed, a conductive (e.g., conductively-doped) portion is typically formed in the pillar section at an interface with the adjacent semiconductor material. These conductive portions are typically formed of a different conductivity type than the pillar section and adjacent semiconductor material. For example, if the pillar section is formed of a p-type semiconductor material, the conductive portion might have an n-type conductivity.

Forming holes through multiple layers typically produces holes of decreasing diameter toward the bottom of the holes due to the nature of the removal processes commonly used in the semiconductor industry. To mitigate against the holes becoming too narrow, formation of arrays of the type described with reference to FIGS. 2A-2B, might be segmented, such that the layers for forming a first portion of the NAND string may be formed, then portions may be removed to define holes, and the remaining structures may be formed within the holes. Following formation of the first portion of the NAND string, a second portion of the NAND string might be formed over the first portion in a similar manner. FIG. 6A depicts a structure of this type. In FIG. 6A, two strings of series-connected memory cells are depicted in the cross-sectional view. It is noted that the spaces between various elements of the figure may represent dielectric material.

With reference to FIG. 6A, a first NAND string includes a first pillar section $\mathbf{340}_{00}$ and a second pillar section $\mathbf{340}_{10}$.

The first pillar section $340_{00}$ and the second pillar section $340_{10}$ may each be formed of a semiconductor material of a first conductivity type, such as a p-type polysilicon. Conductive portions $342_{00}$ and $342_{10}$ may be formed at the bottoms of the pillar sections $340_{00}$ and $340_{10}$, respectively, with the conductive portion $342_{00}$ electrically connected to the source 216 and the conductive portion $342_{10}$ electrically connected to the pillar section $340_{00}$. The conductive portions $342_{00}$ and $342_{10}$ may be formed of a semiconductor material of a second conductivity type different than the first conductivity type. For the example where the first pillar section $340_{00}$ and the second pillar section $340_{10}$ may each be formed of a p-type polysilicon, the conductive portions $342_{00}$ and $342_{10}$ might be formed of an n-type semiconductor material, such as an n-type polysilicon. In addition, the conductive portions $342_{00}$ and $342_{10}$ might have a higher conductivity level than the pillar sections $340_{00}$ and $340_{10}$. For example, the conductive portions $342_{00}$ and $342_{10}$ might have an n+ conductivity. Alternatively, the conductive portions $342_{00}$ and $342_{10}$ may be formed of a conductor, e.g., a metal or metal silicide.

The pillar section $340_{10}$ is electrically connected to the data line 204 through a conductive plug $344_0$. The conductive plug $344_0$, in this example, might also be formed of a semiconductor material of the second conductivity type, and may likewise have a higher conductivity level than the pillar sections $340_{00}$ and $340_{10}$. Alternatively, the conductive plug $344_0$ may be formed of a conductor, e.g., a metal or metal silicide. The first NAND string further includes a source select gate at an intersection of the source select line 214 and the pillar section $340_{00}$, and a drain select gate at an intersection of the drain select line 215 and the pillar section $340_{10}$. The first NAND string further includes a memory cell at an intersection of each of the access lines $202_0$-$202_7$ and the pillar sections $340_{00}$ and $340_{10}$. These memory cells further include data-storage structures $234_{00}$-$234_{70}$. While the structure of FIG. 6A is depicted to include only eight access lines 202 in an effort to improve readability of the figure, a typical NAND structure might have significantly more access lines 202.

Although not all numbered, for clarity of FIG. 6A, data-storage structures 234 are depicted on both sides of the pillar sections 340. Individual data-storage structures 234 may wrap completely around their respective pillar section 340, thus defining a data-storage structure 234 for a single memory cell. Alternatively, structures are known having segmented data-storage structures 234, such that more than one (e.g., two) memory cells are defined at each intersection of an access line 202 and a pillar section 340. Embodiments described herein are independent of the number of memory cells defined around a pillar section 340.

To improve the conductivity across the conductive portion $342_{10}$, the first NAND string may further include an intermediate gate at an intersection of the select line 217. This divides the memory cells of the first NAND string into a first deck of memory cells $240_0$ and a second deck of memory cells $240_1$.

The decks of memory cells 240 can generally be thought of as groupings of memory cells sharing a common pillar section 340, i.e., a single pillar section 340 acting as channel regions for that grouping of memory cells, and can be extended to include a plurality of groupings of memory cells, where each such grouping of memory cells shares a common pillar section 340, and the respective common pillar sections 340 are formed at the same level (e.g., are intersected by the same access lines 202), which may include all such groupings of memory cells sharing a common set (e.g., one or more) of access lines 202. For example, deck of memory cells $240_0$ may include those memory cells formed at the intersections of access lines $202_0$ and $202_1$ with the pillar section $340_{00}$. The deck of memory cells $240_0$ may further include those memory cells formed at the intersections of access lines $202_0$ and $202_1$ with their respective pillar sections $340_{00}$ and $340_{01}$, and may still further include all memory cells formed at the intersections of access lines $202_0$ and $202_1$ with the pillar sections $340_{00}$ and $340_{01}$, and any other pillar sections 340 formed at the same level.

With further reference to FIG. 6A, a second NAND string includes the first pillar section $340_{01}$ and a second pillar section $340_{11}$. The first pillar section $340_{01}$ and a second pillar section $340_{11}$ may each be formed of a semiconductor material of the first conductivity type, such as a p-type polysilicon. Conductive portions $342_{01}$ and $342_{11}$ may be formed at the bottoms of the pillar sections $340_{01}$ and $340_{11}$, respectively, with the conductive portion $342_{01}$ electrically connected to the source 216 and the conductive portion $342_{11}$ electrically connected to the pillar section $340_{01}$. The conductive portions $342_{01}$ and $342_{11}$ may be formed of a semiconductor material of the second conductivity type. For the example where the first pillar section $340_{01}$ and a second pillar section $340_{11}$ may each be formed of a p-type polysilicon, the conductive portions $342_{01}$ and $342_{11}$ might be formed of an n-type semiconductor material, such as an n-type polysilicon. In addition, the conductive portions $342_{01}$ and $342_{11}$ might have a higher conductivity level than the pillar sections $340_{01}$ and $340_{11}$. For example, the conductive portions $342_{01}$ and $342_{11}$ might have an n+ conductivity.

The pillar section $340_{11}$ is electrically connected to the data line 204 through a conductive plug $344_1$. The conductive plug $344_1$, in this example, might also be formed of a semiconductor material of the second conductivity type, and may likewise have a higher conductivity level than the pillar sections $340_{01}$ and $340_{11}$. Alternatively, the conductive plug $344_1$ may be formed of a conductor, e.g., a metal or metal silicide. The second NAND string further includes a source select gate at an intersection of the source select line 214 and the pillar section $340_{01}$, and a drain select gate at an intersection of the drain select line 215 and the pillar section $340_{11}$. The second NAND string further includes a memory cell at an intersection of each of the access lines $202_0$-$202_7$ and the pillar sections $340_{01}$ and $340_{11}$. These memory cells further include data-storage structures $234_{01}$-$234_{71}$.

To improve the conductivity across the conductive portion $342_{11}$, the second NAND string further includes an intermediate gate at an intersection of the select line 217 and the pillar section $340_{11}$. This divides the memory cells of the second NAND string into the first deck of memory cells $240_0$ and the second deck of memory cells $240_1$.

Figure 6B:
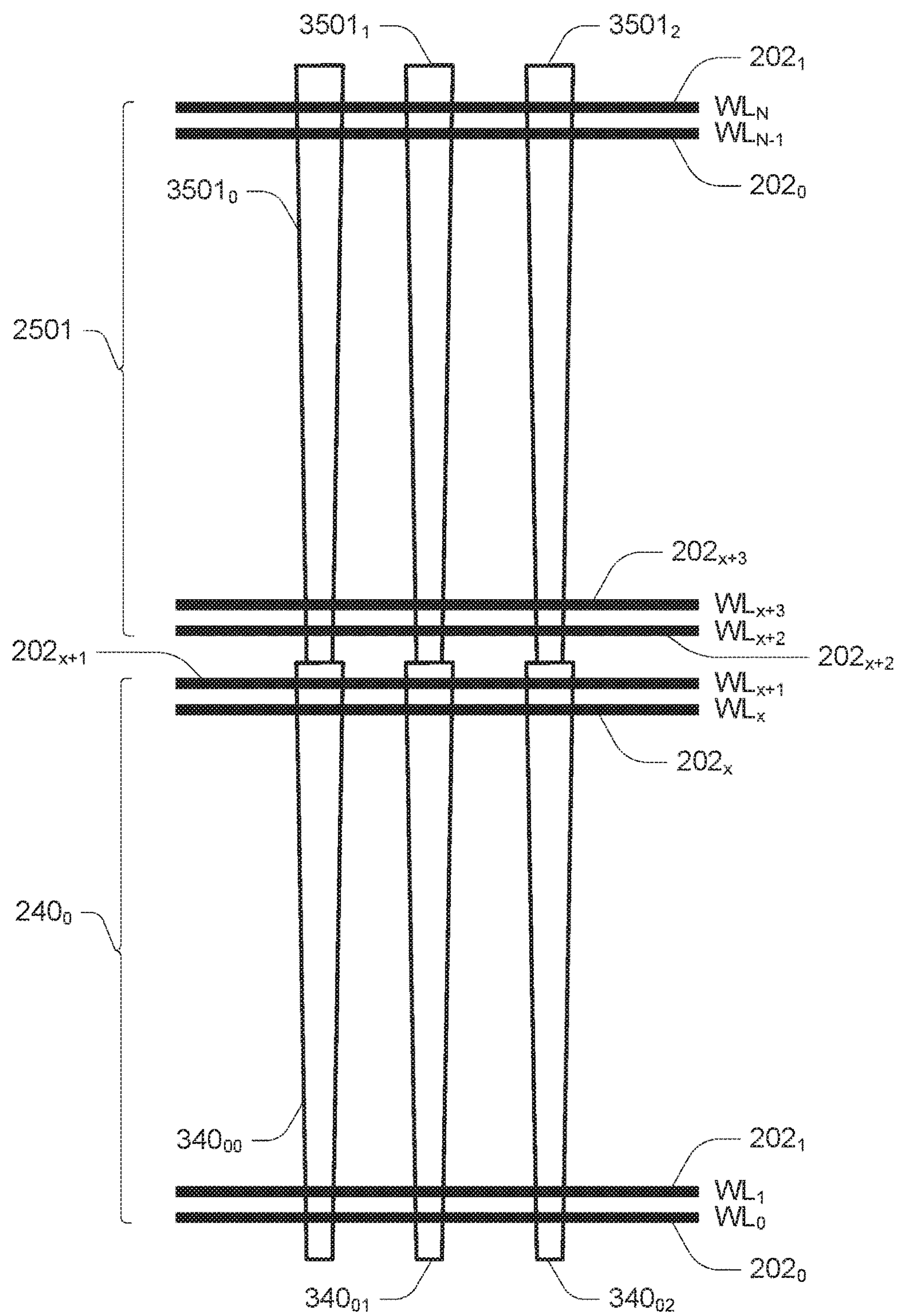
FIG. 6B is a simplified cross-sectional view of a portion of a block of memory cells as might be used with various embodiments.

FIG. 6B is a simplified cross-sectional view of a portion of a block of memory cells as might be used with various embodiments. In a structure of the type depicted in FIGS. 6A and 6B, memory cells coupled to access lines near the middle of a deck 240 may tend to produce similar distributions of erase threshold voltages. However, differences may be experienced for access lines at the top and/or bottom of the NAND string 206, as well as near the interface between decks 240. One example of de-biasing access lines for an erase operation on a block of the structure depicted in FIG. 6B might include applying, during an erase pulse, 0V to the access lines $202_0$ (e.g., $WL_0$) and $202_N$ (e.g., $WL_N$), 1V to the access lines $202_1$ (e.g., $WL_1$) and $202_{N-1}$ (e.g., $WL_{N-1}$), and 2V to the access lines $202_x$ (e.g., $WL_x$) through $202_{x+3}$ (e.g., $WL_{x+3}$). This would generally require three different voltage supplies for the three different access line voltages just for the examples noted. Various embodiments seek to address this variation in erase threshold voltage distributions, and may facilitate a further narrowing of the threshold voltage distribution of a block of memory cells with an accompanying reduction of a number of required voltage supplies over the prior art.

Figure 7:
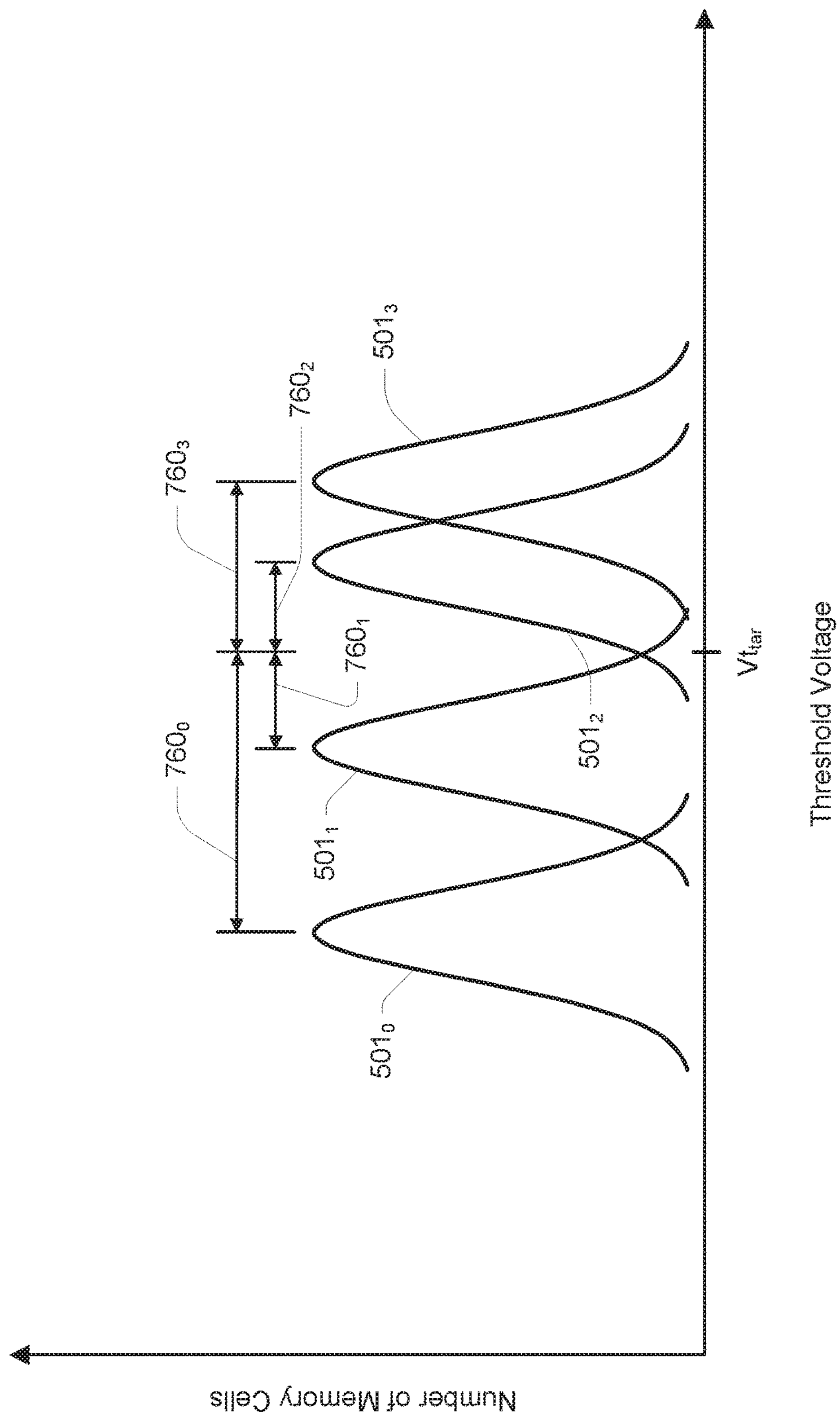
FIG. 7 depicts a visualization of erase threshold voltage distributions for individual access lines in accordance with an embodiment.

FIG. 7 depicts a visualization of erase threshold voltage distributions for individual access lines in accordance with an embodiment. For simplification of the figure and discussion, only a small sampling of erase threshold voltage distributions 501 are shown. The erase threshold voltage distributions 501 may each represent the distribution of erase threshold voltages of memory cells (e.g., of a block of memory cells) coupled to a single access line of a block of memory cells, or memory cells coupled to multiple access lines of the block of memory cells. The memory cells corresponding to a particular erase threshold voltage distribution 501 may include all memory cells couple to the access line (or access lines), or to some subset of those memory cells. The erase threshold voltage distributions 501 may be the result of applying a particular voltage to each of the access lines while applying an erase pulse to the channel regions of the corresponding memory cells. In addition, the erase threshold voltage distributions 501 might be determined, in whole or in part, empirically or through simulation.

In FIG. 7, the references 760 each represent a voltage difference between a target (e.g., desired) erase threshold voltage ($Vt_{tar}$) and a representative value of a corresponding erase threshold voltage distribution 501. The representative value might be a mode, median or mean of the corresponding erase threshold voltage distribution 501. It might also be some other value representative of the corresponding erase threshold voltage distribution 501, e.g., a minimum threshold voltage, a maximum threshold voltage, or some other value deemed representative. Determining the values of the erase threshold voltage distributions 501 is known in the art, and may include applying a ramped read voltage during an erase verify operation, and monitoring the number of memory cells activating at different levels of the ramped read voltage. However, the embodiments are not dependent on a particular method of determining values of these distributions.

As can be seen in the example of FIG. 7, the representative value of the erase threshold voltage distribution $\mathbf{501}_1$ is lower than (e.g., less than) the target erase threshold voltage $Vt_{tar}$ by the voltage difference $\mathbf{760}_1$. The representative value of the erase threshold voltage distribution $\mathbf{501}_0$ is lower than the target erase threshold voltage $Vt_{tar}$ by the voltage difference $\mathbf{760}_0$, which is greater than the voltage difference $\mathbf{760}_1$. In contrast, the representative value of the erase threshold voltage distributions $\mathbf{501}_2$ and $\mathbf{501}_3$ are each higher than (e.g., greater than) the target erase threshold voltage $Vt_{tar}$ by the voltage differences $\mathbf{760}_2$ and $\mathbf{760}_3$, respectively, with the voltage difference $\mathbf{760}_2$ being less than the voltage difference $\mathbf{760}_3$.

From FIG. 7, it may be seen that if a second voltage, higher than the particular voltage, was applied to the access line(s) corresponding to the erase threshold voltage distribution $\mathbf{501}_1$ during the same erase pulse, its erase threshold voltage distribution $\mathbf{501}_1$ might shift toward the target erase threshold voltage $Vt_{tar}$, which might facilitate moving its representative value to be similar to (e.g., equal to) the target erase threshold voltage $Vt_{tar}$. In particular, by applying a lower voltage differential between the channel region and the control gate through the use of a higher control gate voltage, fewer charges might be expected to be removed from the data-storage structure, thus shifting the resulting erase threshold voltage distribution to the right. Similarly, if a third voltage, higher than the second voltage, was applied to the access line(s) corresponding to the erase threshold voltage distribution $\mathbf{501}_0$ during the same erase pulse, its erase threshold voltage distribution $\mathbf{501}_0$ might shift toward the target erase threshold voltage $Vt_{tar}$ by a larger amount, which might facilitate moving its representative value to be similar to (e.g., equal to) the target erase threshold voltage $Vt_{tar}$.

Furthermore, if a fourth voltage, lower than the particular voltage, was applied to the access line(s) corresponding to the erase threshold voltage distribution $\mathbf{501}_2$ during the same erase pulse, its erase threshold voltage distribution $\mathbf{501}_2$ might shift toward the target erase threshold voltage $Vt_{tar}$, which might facilitate moving its representative value to be similar to (e.g., equal to) the target erase threshold voltage $Vt_{tar}$. In particular, by applying a higher voltage differential between the channel region and the control gate through the use of a lower control gate voltage, additional charges might be expected to be removed from the data-storage structure, thus shifting the resulting erase threshold voltage distribution to the left. Similarly, if a fifth voltage, lower than the fourth voltage, was applied to the access line(s) corresponding to the erase threshold voltage distribution $\mathbf{501}_3$ during the same erase pulse, its erase threshold voltage distribution $\mathbf{501}_3$ might shift toward the target erase threshold voltage $Vt_{tar}$ by a larger amount, which might facilitate moving its representative value to be similar to (e.g., equal to) the target erase threshold voltage $Vt_{tar}$.

For some embodiments, the target erase threshold voltage may be determined after determining the erase threshold voltage distributions 501. For example, the target erase threshold voltage $Vt_{tar}$ may be chosen such that no erase threshold voltage distribution 501 has a representative value greater than the target erase threshold voltage $Vt_{tar}$. Alternatively, the target erase threshold voltage $Vt_{tar}$ may be chosen such that no erase threshold voltage distribution 501 would be expected to have a representative value greater than the target erase threshold voltage $Vt_{tar}$. In this manner, each erase threshold voltage distribution 501 might be shifted toward the target erase threshold voltage $Vt_{tar}$ by applying a voltage higher than the particular voltage during a same erase pulse.

With regard to the example of FIG. 7, the differences between the particular voltage and the second, third, fourth and fifth voltages might be referred to a bias differences. For some embodiments, the bias differences corresponding to the individual erase threshold voltage distributions 501 might be deemed to be equal to their respective voltage differences 760, e.g., equal to ($Vt_{tar}$—the representative value). For other embodiments, a correction might be applied to the respective voltage differences 760. For example, each voltage difference 760 might be multiplied by some constant corresponding to the respective access line(s). This constant might be the same for all access lines of a block of memory cells, or there might be different constants for different access lines. Values of such constants or other corrections might be determined experimentally, empirically or through simulation.

Figure 8:
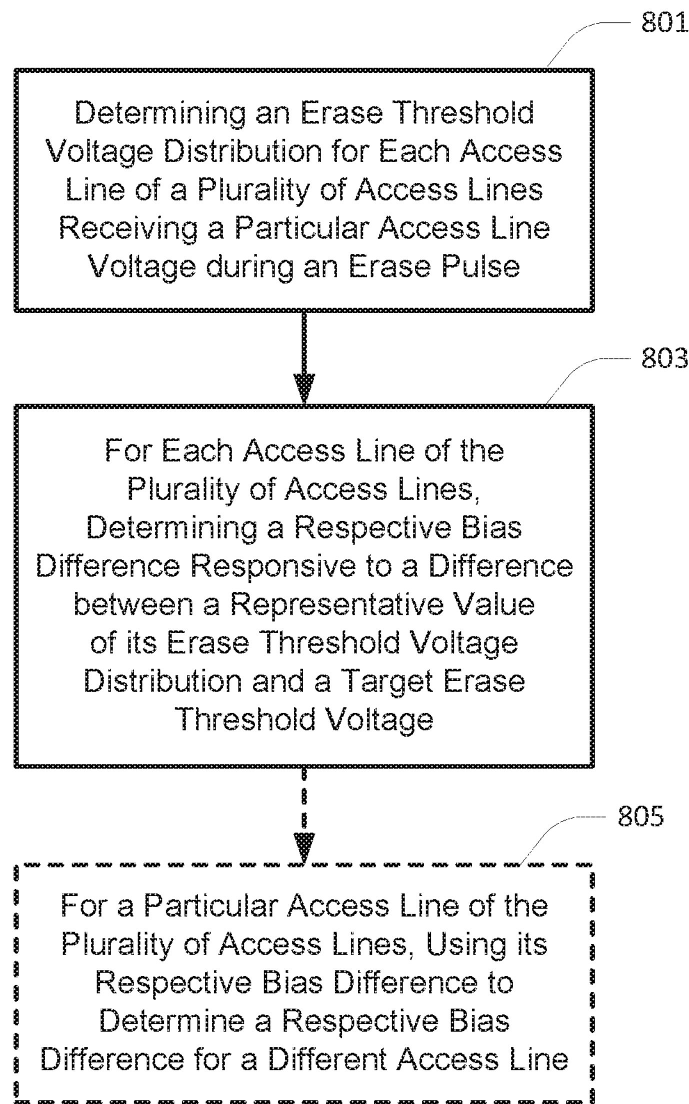
FIG. 8 is a flowchart of a method of operating a memory in accordance with an embodiment.

FIG. 8 is a flowchart of a method of operating a memory in accordance with an embodiment. At 801, an erase threshold voltage distribution is determined for each access line of a plurality of access lines receiving a particular access line voltage during an erase pulse. For example, the plurality of access lines may include the access lines, e.g., word lines, of a string of series-connected memory cells. For some embodiments, the plurality of access lines may include less than all access lines of a string of series-connected memory cells. For example, a sampling of some portion of the access lines of a string of series-connected memory cells might be used.

The erase pulse may be a voltage level applied to channel regions of the memory cells of a string of series-connected memory cells, such as by applying the voltage level to a data line and source connected to the string of series-connected memory cells, for a period of time. The particular access line voltage may be a voltage level applied to each of the access lines of the plurality of access lines for a period of time concurrent with the erase pulse. As used herein, a first act and a second act occur concurrently when the first act occurs simultaneously with the second act for at least a portion of a duration of the second act. For example, for at least a portion of the time of applying the erase pulse, the particular access line voltage is being applied simultaneously to the access lines of the plurality of access lines. As one example, an erase pulse of 25V and a particular access line voltage of 0V might be expected to remove charge from a data-storage structure of a non-volatile memory cells.

A respective bias difference is determined at 803 for each access line of the plurality of access lines. The respective bias difference is determined responsive to a difference between a representative value of each access line's erase threshold voltage distribution and a target erase threshold voltage. The respective bias difference might be a value of an access line voltage that would be expected to move the representative value of that access line's erase threshold voltage distribution toward the value of the target erase threshold voltage had it been applied to that access line during the erase pulse. The representative value might be a mode, median or mean of the corresponding erase threshold voltage distribution. It might also be some other value representative of the corresponding erase threshold voltage distribution, e.g., a minimum threshold voltage, a maximum threshold voltage, or some other value deemed representative.

Optionally, at 805, the respective bias difference of a particular access line of the plurality of access lines might be used to determine a respective bias difference for a different access line. As an example, it may be deemed beneficial to not determine a respective bias difference for each access line through the application of an erase pulse. For example, as noted with respect to 801, such testing may include a sampling of access lines of a string of series-connected memory cells. Alternatively or in addition, such testing may include a sampling of blocks of memory cells of a die containing those blocks of memory cells, a sampling of dies per semiconductor wafer containing those dies, a sampling of dies per lot of multiple semiconductor wafers containing those dies, etc., or some combination thereof. As such, the respective bias difference determined for one access line might be used to determine the respective bias difference for one or more other access lines of a same string of series-connected memory cells, for one or more other access lines of different blocks of memory cells, for one or more other access lines of different dies containing blocks of memory cells, etc.

The determination might be made for other access lines expected to have similar operating characteristics as the particular access line. For some situations, the determination may be simply an assignment of the respective bias difference of the particular access line to the other access line. Similarly, where a difference in operating characteristics between the particular access line and a different access line might be expected to result in a particular relationship between their respective bias differences, as might be determined through experimentation, empirical evidence or simulation, the respective bias difference of the particular access line might be corrected in response to the particular relationship in order to determine the respective bias difference of the other access line.

The respective bias differences for each access line may be stored for subsequent use. For example, the respective bias differences might be stored to a trim register 126 or an array of memory cells 104 of a memory 100. For some embodiments, permissible values of the respective bias differences may be predetermined. As one example, there might be eight different values of a bias difference represented by a three bit register, e.g., 000, 001, 010, 011, 100, 101, 110 and 111 could represent bias differences of 0V, 0.25V, 0.5V, 0.75V, 1V, 1.5V, 2V and 2.5V, respectively. In such scenarios, the determined bias difference might be the predetermined value that is closest to the determined (e.g., calculated) value. For some embodiments, the stored bias difference may represent a voltage level to be applied during an erase operation while memory cells coupled to the respective access line are intended for erasure.

Figure 9:
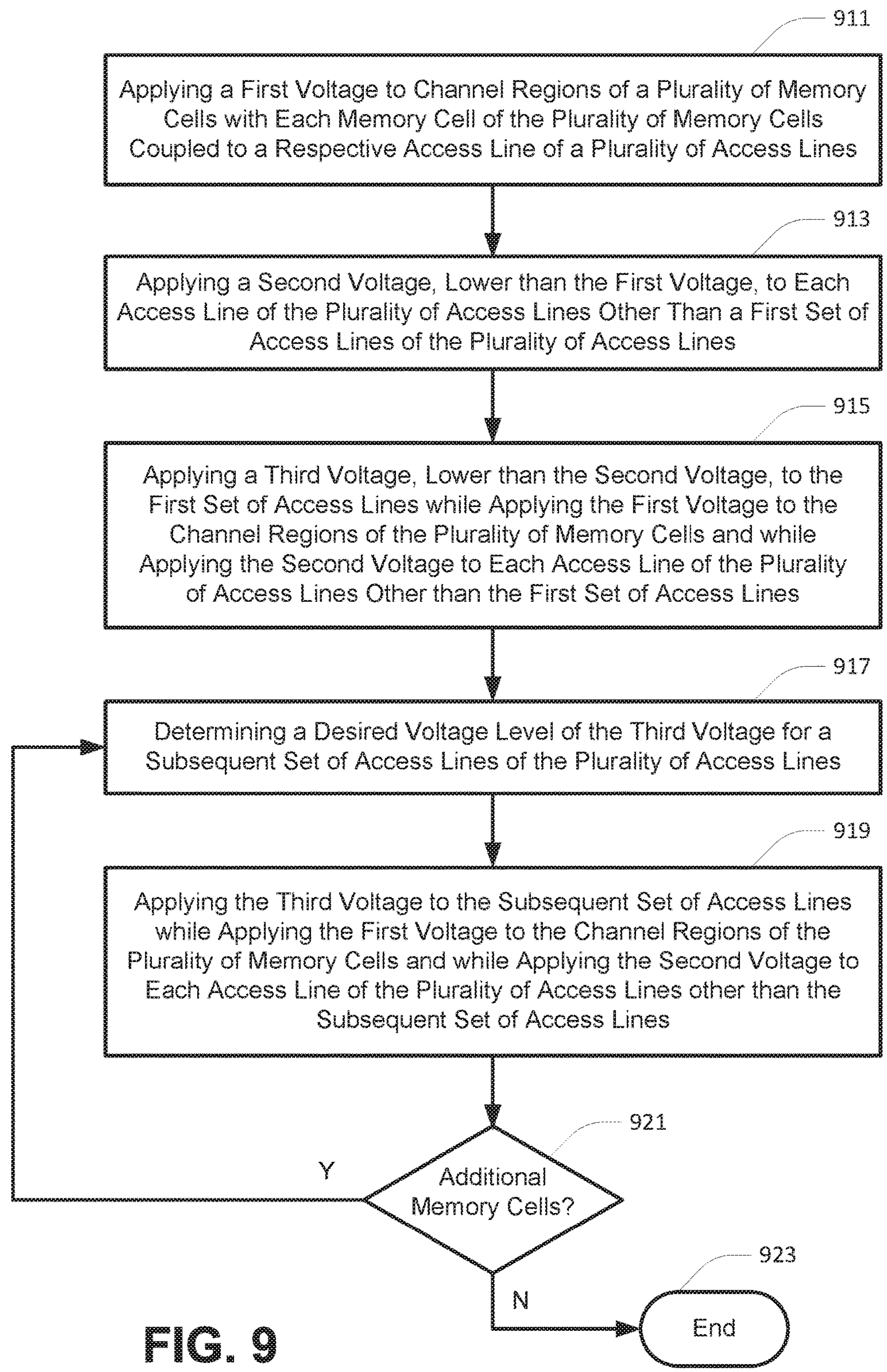
FIG. 9 is a flowchart of a method of operating a memory in accordance with an embodiment.

FIG. 9 is a flowchart of a method of operating a memory in accordance with an embodiment. For example, the method of FIG. 9 may represent an erase operation. At 911, a first voltage is applied to channel regions of a plurality of memory cells, with each memory of the plurality of memory cells coupled to a respective access line of a plurality of access lines. For example, the plurality of access lines may include the access lines, e.g., word lines, of a string of series-connected memory cells. Note that the plurality of access lines may further be coupled to other memory cells, and that the first voltage may be applied to the channel regions of the other memory cells concurrently. For example, the memory cells of a number of strings of series-connected non-volatile memory cells, e.g., a block of memory cells, may receive the first voltage to their channel regions concurrently.

At 913, a second voltage, lower than the first voltage is applied to each access line of the plurality of access lines other than a first set of access lines of the plurality of access lines. The first set of access lines may include one or more access lines of the plurality of access lines. The second voltage applied to access lines other than the first set of access lines may be configured to inhibit erasure of their corresponding memory cells also receiving the first voltage to their channel regions, e.g., inhibit removal of charge from the data-storage nodes of those memory cells.

At 915, a third voltage, lower than the second voltage, is applied to the first set of access lines of the plurality of access lines while applying the first voltage to the channel regions of the plurality of memory cells and while applying the second voltage to each access line of the plurality of access lines other than the first set of access lines. The third voltage applied to the access lines of the first set of access lines may be configured to cause erasure of their corresponding memory cells also receiving the first voltage to their channel regions, e.g., cause removal of charge from the data-storage nodes of those memory cells. The third voltage may be determined from the respective bias difference corresponding to the access lines of the first set of access lines. For example, for one or more access lines having a particular bias difference, the third voltage may be equal to the particular bias difference where the access line voltage applied during a determination of the particular bias difference was 0V. For other situations, the particular bias difference could be added to the access line voltage applied during a determination of the particular bias difference, for example. Note that the particular bias difference might be indirectly determined through testing of one or more different access lines, and the particular bias difference might be a corrected value. For some embodiments, the first set of access lines may be a set of access lines containing more than one access line, where those access lines share similar respective bias differences. For example, those access lines whose respective bias differences each fall within a particular range of values may be deemed to share similar respective bias differences. The particular bias difference for the first set of access lines may represent a mode, median, mean, or other value representative of the similar bias differences of the first set of access lines.

At 917, a desired voltage level of the third voltage may be determined for a subsequent (e.g., different) set of access lines of the plurality of access lines. For example, after some period of time, the third voltage may be removed from the first set of access lines. That period of time may correspond to a time deemed appropriate to cause erasure of the memory cells coupled to the first set of access lines. The desired voltage level of the third voltage may be determined from (e.g., changed to) some value corresponding to a respective bias difference for the subsequent set of access lines of the plurality of access lines, and may be determined as discussed with respect to 915. Generation of various voltage levels is well understood in the art, and might include, for example, the use of an adjustable voltage divider, or adjustable reference voltages applied to a voltage divider. However, embodiments are not dependent upon a method of generating the different voltage levels.

At 919, after determining the desired voltage level of the third voltage for the subsequent set of access lines, the third voltage is applied to the subsequent set of access lines while applying the first voltage to the channel regions of the plurality of memory cells and while applying the second voltage to each access line of the plurality of access lines other than the subsequent set of access lines. The third voltage applied to the access lines of the subsequent set of access lines may be configured to cause erasure of their corresponding memory cells also receiving the first voltage to their channel regions, e.g., cause removal of charge from the data-storage nodes of those memory cells.

At 921, a decision is made whether the application of a voltage other than the second voltage is to be applied to any additional access lines of the plurality of access lines, e.g., whether there is a desire to erase any additional memory cells. If yes, the process returns 917 to change the voltage level of the third voltage, e.g., to correspond to a next set of access lines of the plurality of access lines. This process might be repeated until each access line of the plurality of access lines receives a third voltage, with the voltage level of the respective third voltage being determined in response to a respective bias difference and configured to cause erasure of their corresponding memory cells. Each set of access lines of the plurality of access lines may be mutually exclusive.

For some embodiments, each set of access lines of the plurality of access lines includes a single access line. The process described with reference to FIG. 9 might be performed in sequence, e.g., proceeding from a first access line (e.g., word line $\mathbf{202}_0$ of FIG. 2A) to a last access line (e.g., word line $\mathbf{202}_N$ of FIG. 2A) of a string of series-connected memory cells (e.g., NAND string $\mathbf{206}_0$). The process may further be performed concurrently on all strings of series-connected memory cells of a block of memory cells (e.g., NAND strings $\mathbf{206}_0$-$\mathbf{206}_M$). Other orders might also be used, e.g., proceeding from a last access line to a first access line; proceeding in order of respective bias differences, either from low to high, or high to low; or an order based on any other criteria set by a user of the apparatus.

For some embodiments, each set of access lines of the plurality of access lines includes one or more access lines. The process described with reference to FIG. 9 might be performed in sequence, e.g., proceeding from a first set of access lines (e.g., word lines $\mathbf{202}_0$-$\mathbf{202}_a$), to a second set of access lines (e.g., word line $\mathbf{202}_{a+1}$-$\mathbf{202}_b$), to a third set of access lines (e.g., word line $\mathbf{202}_{b+1}$-$\mathbf{202}_c$), and so one, of a string of series-connected memory cells (e.g., NAND string $\mathbf{206}_0$). The process may further be performed concurrently on all strings of series-connected memory cells of a block of memory cells (e.g., NAND strings $\mathbf{206}_0$-$\mathbf{206}_M$). Other orders might also be used, e.g., proceeding from a last set of access lines to a first set of access lines, or proceeding in order of respective bias differences, either from low to high, or high to low. The sets of access lines used in one block of memory cells may be the same or different in other blocks of memory cells for a given die containing those blocks of memory cells.

Figure 10:
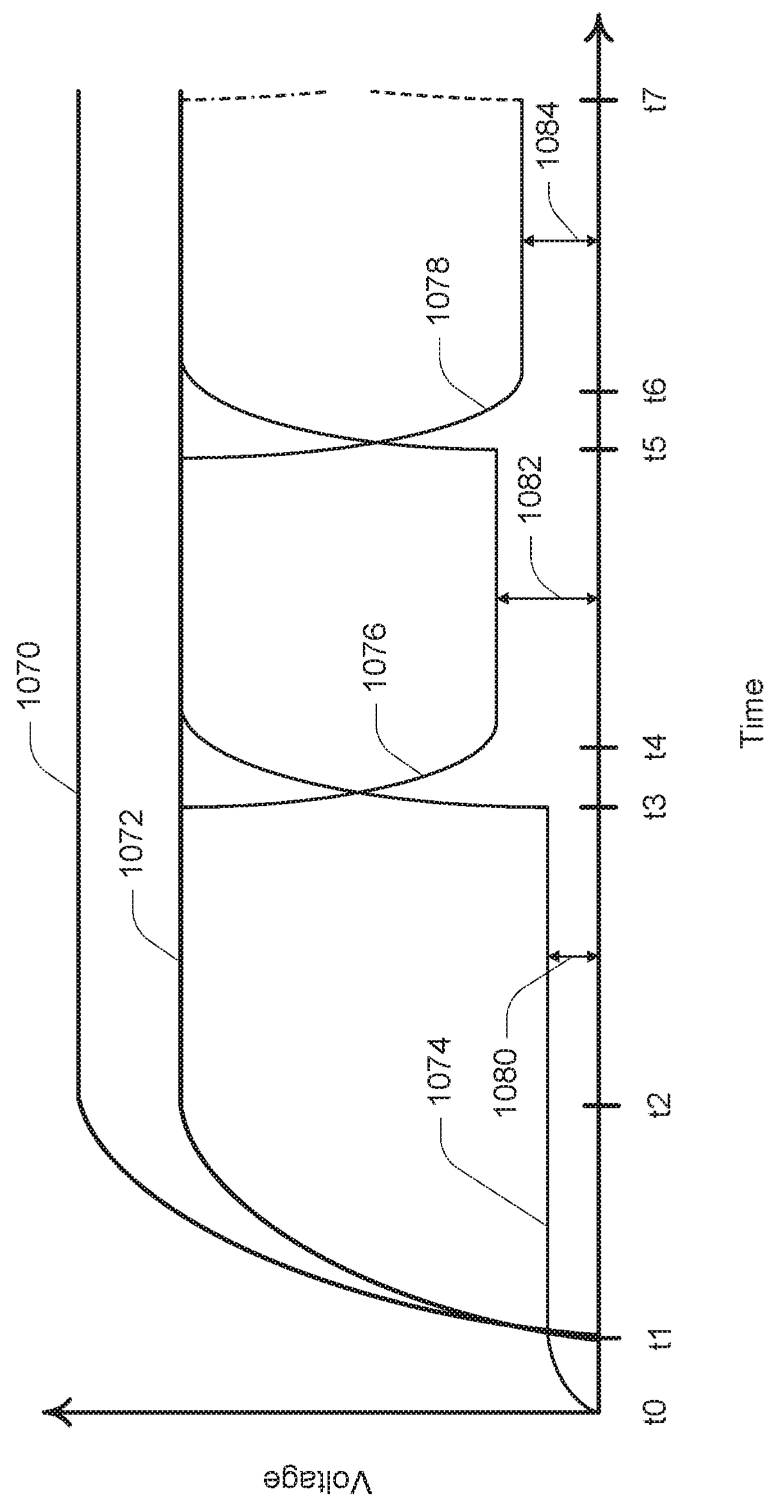
FIG. 10 depicts waveforms of access lines and channel regions for a method of operating a memory in accordance with an embodiment.

FIG. 10 depicts waveforms of access lines and channel regions for a method of operating a memory in accordance with an embodiment. The waveforms of FIG. 10 might represent waveforms of the method of operating a memory as discussed with reference to FIG. 9. In FIG. 10, the waveform 1070 may represent a voltage (e.g., the first voltage of FIG. 9) applied to channel regions of a plurality of memory cells, e.g., the memory cells of one or more strings of series-connected non-volatile memory cells. As one example, the voltage level of the waveform 1070 may be 25V. The waveform 1072 may represent a voltage (e.g., the second voltage of FIG. 9) applied to access lines for which there is a desire to inhibit erasure of their corresponding memory cells. As one example, the voltage level of the waveform 1072 may be 20V. The waveforms 1074, 1076 and 1078 may represent the different voltage levels of the voltage (e.g., the third voltage of FIG. 9) applied to different sets of access lines at different time periods in order to cause erasure of the corresponding memory cells.

For example, at time to, the voltage of waveform 1074 might be applied to a first set of access lines. The first set of access lines may contain one or more access lines. The first set of access lines may contain a contiguous grouping of one or more access lines. Alternatively, the first set of access lines may contain access lines that are expected (e.g., through experimentation, empirical evidence or simulation) to have similar operating characteristics, whether contiguous or not. Access lines might be deemed to have similar operating characteristics when their expected erase threshold distributions under the same erase conditions have representative values within a particular range of values. As one example, access lines having a determined bias difference closest to a same value of a set of permissible values might be deemed to have similar operating characteristics. At time t1, the voltage of waveform 1070 may be applied to the channel regions of the memory cells while the voltage of the waveform 1072 is applied to access lines other than the first set of access lines. The voltage of waveform 1074 applied to the first set of access lines might be allowed to attain its desired voltage level 1080 prior to applying the voltage of the waveform 1070 to the channel regions of the memory cells, e.g., to avoid applying a voltage difference between the channel region and the control gate of a memory cell that is larger than desired in view of the respective bias difference of its access line.

At time t2, the voltage of the waveforms 1070 and 1072 may attain their desired voltage levels. For a time period from time t2 to time t3, the first set of access lines receives the voltage level 1080 while remaining access lines receive the voltage of the waveform 1072 and while the channel regions of the memory cells receive the voltage of the waveform 1070. The time period from time t2 to time t3 may be a time period expected to be sufficient to remove charge to a particular level, e.g., such that memory cells coupled to the first set of access lines might be expected to have an erase threshold voltage distribution having a representative value equal to the target erase threshold voltage. The voltage level 1080 may be determined from (e.g., calculated from or equal to), the respective bias difference of the first set of access lines. At time t3, the voltage applied to the first set of access lines is transitioned (e.g., switched) to the voltage of the wave form 1072.

Also at time t3, the voltage applied to a subsequent set of access lines may be transitioned (e.g., switched) from the voltage of the waveform 1072 to the voltage of the waveform 1076. The subsequent set of access lines may contain one or more access lines. The subsequent set of access lines may contain a contiguous grouping of one or more access lines, and the contiguous grouping of the subsequent set of access lines may or may not be immediately adjacent to a contiguous grouping of the first set of access lines. Alternatively, the subsequent set of access lines may contain access lines that are expected (e.g., through experimentation, empirical evidence or simulation) to have similar operating characteristics, whether contiguous or not. At time t4, the voltage of the waveform 1076 may attain its desired voltage level 1082. For a time period from time t4 to time t5, the subsequent set of access lines receives the voltage level 1082 while remaining access lines receive the voltage of the waveform 1072 and while the channel regions of the memory cells receive the voltage of the waveform 1070. The time period from time t4 to time t5 may be a time period expected to be sufficient to remove charge to a particular level, e.g., such that memory cells coupled to the subsequent set of access lines might be expected to have an erase threshold voltage distribution having a representative value equal to the target erase threshold voltage. The time period from time t4 to t5 may be equal to the time period from time t2 to time t3. The voltage level 1082 may be determined from (e.g., calculated from or equal to), the respective bias difference of the subsequent set of access lines. At time t5, the voltage applied to the subsequent set of access lines is transitioned (e.g., switched) to the voltage of the waveform 1072.

Also at time t5, the voltage applied to a subsequent (e.g., next subsequent) set of access lines may be transitioned (e.g., switched) from the voltage of the waveform 1072 to the voltage of the waveform 1078. The next subsequent set of access lines may contain one or more access lines. The next subsequent set of access lines may contain a contiguous grouping of one or more access lines, and the contiguous grouping of the next subsequent set of access lines may be immediately adjacent to a contiguous grouping of the prior subsequent set of access lines. Alternatively, the next subsequent set of access lines may contain access lines that are expected (e.g., through experimentation, empirical evidence or simulation) to have similar operating characteristics, whether contiguous or not. At time t6, the voltage of the waveform 1078 may attain its desired voltage level 1084. For a time period from time t6 to time t7, the next subsequent set of access lines receives the voltage level 1084 while remaining access lines receive the voltage of the waveform 1072 and while the channel regions of the memory cells receive the voltage of the waveform 1070. The time period from time t6 to time t7 may be a time period expected to be sufficient to remove charge to a particular level, e.g., such that memory cells coupled to the next subsequent set of access lines might be expected to have an erase threshold voltage distribution having a representative value equal to the target erase threshold voltage. The time period from time t6 to time t7 may be equal to the time period from time t2 to time t3. The voltage level 1084 may be determined from (e.g., calculated from or equal to), the respective bias difference of the next subsequent set of access lines. At time t7, the voltage applied to the subsequent set of access lines is transitioned (e.g., switched) to the voltage of the waveform 1072 and the process might be repeated for additional subsequent sets of access lines, e.g., until all of the access lines have received a voltage level corresponding to their respective bias difference while their memory cells have received the voltage of the waveform 1070 applied to their channel regions.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method, comprising:

applying a first voltage to channel regions of a plurality of memory cells, with each memory cell of the plurality of memory cells coupled to a respective access line of a plurality of access lines, wherein the plurality of access lines comprises a plurality of sets of access lines;

applying a second voltage, having a voltage level lower than a voltage level of the first voltage, to each access line of the plurality of access lines other than a first set of access lines of the plurality of sets of access lines, wherein each set of access lines of the plurality of sets of access lines has a respective third voltage;

applying the respective third voltage for the first set of access lines, having a voltage level lower than the voltage level of the second voltage, to the first set of access lines while applying the first voltage to the channel regions of the plurality of memory cells and while applying the second voltage to each access line of the plurality of access lines other than the first set of access lines;

determining a desired voltage level of the respective third voltage for a subsequent set of access lines of the plurality of sets of access lines; and after determining the desired voltage level of the respective third voltage for the subsequent set of access lines and after applying the respective third voltage for the first set of access lines, applying the respective third voltage for the subsequent set of access lines to the subsequent set of access lines while continuing to apply the first voltage to the channel regions of the plurality of memory cells and while applying the second voltage to each access line of the plurality of access lines other than the subsequent set of access lines.

2. The method of claim 1, wherein the subsequent set of access lines is a first subsequent set of access lines of the plurality of sets of access lines, the method further comprising:

determining a desired voltage level of the respective third voltage for a next subsequent set of access lines of the plurality of access lines of the plurality of sets of access lines; and after determining the desired voltage level of the respective third voltage for the next subsequent set of access lines, applying the respective third voltage for the next subsequent set of access lines to the next subsequent set of access lines while continuing to apply the first voltage to the channel regions of the plurality of memory cells and while applying the second voltage to each access line of the plurality of access lines other than the next subsequent set of access lines.

3. The method of claim 1, wherein the first set of access lines and the subsequent set of access lines are mutually exclusive sets of access lines.

4. The method of claim 3, wherein the first set of access lines consists of a single access line of the plurality of access lines.

5. The method of claim 4, wherein the subsequent set of access lines consists of a single access line of the plurality of access lines.

6. The method of claim 3, wherein the first set of access lines comprises a contiguous grouping of one or more access lines coupled to respective memory cells of a string of series-connected memory cells of the plurality of memory cells.

7. The method of claim 6, wherein the subsequent set of access lines comprises a contiguous grouping of one or more access lines coupled to respective memory cells of the string of series-connected memory cells.

8. The method of claim 7, wherein the contiguous grouping of the subsequent set of access lines is contiguous with the contiguous grouping of the first set of access lines.

9. The method of claim 3, wherein the first set of access lines comprises a set of access lines deemed to have similar operating characteristics.

10. The method of claim 9, wherein the set of access lines deemed to have similar operating characteristics is not contiguous.

11. The method of claim 1, the method further comprising:

for each subsequent set of access lines of the plurality of sets of access lines for a plurality of subsequent sets of access lines of the plurality of sets of access lines:

determining a desired voltage level of the respective third voltage for that subsequent set of access lines of the plurality of subsequent sets of access lines; and after determining the desired voltage level of the respective third voltage for that subsequent set of access lines, applying the respective third voltage for that subsequent set of access lines to that subsequent set of access lines while continuing to apply the first voltage to the channel regions of the plurality of memory cells and while applying the second voltage to each access line of the plurality of access lines other than that subsequent set of access lines.

12. The method of claim 1, further comprising:

determining an erase threshold voltage distribution for each access line of the first set of access lines in response to receiving a particular access line voltage during an erase pulse;

determining a respective bias difference of the first set of access lines responsive to a difference between a representative value of the erase threshold voltage distribution and a target erase threshold voltage; and determining a voltage level of the respective third voltage for the first set of access lines from the respective bias difference of the first set of access lines.

13. The method of claim 12, further comprising:

determining an erase threshold voltage distribution for each access line of the subsequent set of access lines in response to receiving the particular access line voltage during the erase pulse;

determining a respective bias difference of the subsequent set of access lines responsive to a difference between a representative value of its erase threshold voltage distribution and the target erase threshold voltage; and determining the desired voltage level of the respective third voltage for the subsequent set of access lines from the respective bias difference of the subsequent set of access lines.

14. A method, comprising:

determining a respective erase threshold voltage distribution for each access line of a plurality of access lines receiving a particular access line voltage during an erase pulse;

for each access line of the plurality of access lines, determining a representative value of its respective erase threshold voltage distribution; and for each access line of the plurality of access lines, determining a respective bias difference responsive to a difference between the representative value of its respective erase threshold voltage distribution and a target erase threshold voltage.

15. The method of claim 14, wherein the erase pulse comprises a applying a voltage to channel regions of memory cells coupled to the access lines of the plurality of access lines.

16. The method of claim 14, wherein a difference between the voltage applied to the channel regions of the memory cells coupled to the access lines of the plurality of access lines and the particular access line voltage is configured to cause erasure of data-storage nodes of the memory cells coupled to the access lines of the plurality of access lines.

17. The method of claim 14, further comprising:

for a particular access line of the plurality of access lines, using its respective bias difference to determine a respective bias difference for a different access line.

18. The method of claim 14, further comprising selecting the target erase threshold voltage such that the difference between the target erase threshold voltage and the representative value of the respective erase threshold voltage distribution for a given access line of the plurality of access lines is expected to be a value greater than or equal to zero for each access line of the plurality of access lines.

19. A method, comprising:

applying a first voltage to channel regions of a plurality of memory cells, with each memory cell of the plurality of memory cells coupled to a respective access line of a plurality of access lines; and for each set of access lines of a plurality of sets of access lines of the plurality of access lines:

applying a second voltage, having a voltage level lower than a voltage level of the first voltage, to each access line of the plurality of access lines other than that set of access lines, wherein each set of access lines of die plurality of sets of access lines has a respective third voltage;

determining a desired voltage level of the respective third voltage, having a voltage level lower than the voltage level of the second voltage, for that set of access lines;

applying the respective third voltage for that set of access lines to that set of access lines while continuing to apply the first voltage to the channel regions of the plurality of memory cells and while applying the second voltage to each access line of the plurality of access lines other than that set of access lines; and after a time period corresponding to that set of access lines, transitioning that set of access lines to the second voltage;

wherein, for a particular set of access lines of the plurality of sets of access lines, applying the respective third voltage for the particular set of access lines to the particular set of access lines while continuing to apply the first voltage to the channel regions of the plurality of memory cells comprises:

transitioning a voltage level applied to the particular set of access lines from the voltage level of the second voltage to the voltage level of the respective third voltage for the particular set of access lines while continuing to apply the first voltage to the channel regions of the plurality of memory cells; and transitioning a voltage level applied to a different set of access lines of the plurality of sets of access lines from the voltage level of the respective third voltage for the different set of access lines to the voltage level of the second voltage while continuing to apply the first voltage to the channel regions of the plurality of memory cells.

20. The method of claim 19, wherein determining the desired voltage level of the respective third voltage for a given set of access lines of the plurality of sets of access lines comprises reading a stored value corresponding to that desired voltage level.

21. The method of claim 19, wherein applying the first voltage to the channel regions of the plurality of memory cells while applying the second voltage to a given set of access lines of the plurality of sets of access lines is configured to inhibit erasure of memory cells coupled to that given set of access lines.

22. The method of claim 21, wherein applying the first voltage to the channel regions of the plurality of memory cells while applying the respective third voltage for the given set of access to the given set of access lines is configured to cause erasure of memory cells coupled to that given set of access lines.

23. The method of claim 19, wherein determining the desired voltage level of the respective third voltage for each set of access lines of the plurality of sets of access lines comprises determining a voltage level expected to cause a respective erase threshold voltage distribution for each set of access lines of the plurality of sets of access lines to have respective representative values approaching a target erase threshold voltage.

24. The method of claim 19, wherein the time periods corresponding to each respective set of access lines of the plurality of sets of access lines are each a same length of time.

25. The method of claim 19, wherein a first set of access lines of the plurality of sets of access lines to receive its respective third voltage and a next set of access lines of the plurality of sets of access line to receive its respective third voltage do not form a contiguous set of access lines of the plurality of access lines.

26. The method of claim 25, wherein access lines of the first set of access lines are not contiguous with each other.

* * * * *

UNITED STATES PATENT AND TRADEMARK OFFICE

CERTIFICATE OF CORRECTION

PATENT NO. : 10,332,601 B2
APPLICATION NO. : 15/687581
DATED : June 25, 2019
INVENTOR(S) : Yip It is certified that error appears in the above-identified patent and that said Letters Patent is hereby corrected as shown below:

In the Claims

Column 21, Claim 19, Line 5, delete “of die plurality” and insert in place thereof --of the plurality--.

Signed and Sealed this
Fourth Day of February, 2020

Andrei Iancu
*Director of the United States Patent and Trademark Office*